United States Patent
Sakaguchi

(10) Patent No.: US 9,119,272 B2
(45) Date of Patent: Aug. 25, 2015

(54) ORGANIC ELECTROLUMINESCENT ELEMENT AND ORGANIC ELECTROLUMINESCENT LIGHTING DEVICE

(75) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 13/995,357

(22) PCT Filed: Dec. 22, 2011

(86) PCT No.: PCT/JP2011/079815
§ 371 (c)(1),
(2), (4) Date: Jun. 18, 2013

(87) PCT Pub. No.: WO2012/086758
PCT Pub. Date: Jun. 28, 2012

(65) Prior Publication Data
US 2013/0270994 A1 Oct. 17, 2013

(30) Foreign Application Priority Data
Dec. 24, 2010 (JP) ................................. 2010-287823

(51) Int. Cl.
*H01L 51/54* (2006.01)
*H05B 33/26* (2006.01)
*H01L 51/52* (2006.01)

(52) U.S. Cl.
CPC ............ *H05B 33/26* (2013.01); *H01L 51/5212* (2013.01)

(58) Field of Classification Search
CPC ... H01L 51/5228; H01L 51/52; H01L 27/329; H01L 27/3297; H01L 33/42; H01L 51/102; H01L 33/36; H01L 51/5212; H05B 33/26; H05B 33/20; H01J 2217/49207; H01J 11/22; H01J 11/28; H01J 2211/38; F21Y 2105/008; F21Y 2105/006
USPC .................................................. 313/498–512
See application file for complete search history.

(56) References Cited

U.S. PATENT DOCUMENTS 5,445,711 A 8/1995 Tanski et al.
5,559,399 A 9/1996 Tanski et al.
(Continued)

FOREIGN PATENT DOCUMENTS

JP 8-505257 6/1996
JP 11-008073 1/1999
(Continued)

OTHER PUBLICATIONS

International Search Report, PCT/JP2011/079815, Jan. 31, 2012.
(Continued)

*Primary Examiner* — Donald Raleigh
(74) *Attorney, Agent, or Firm* — Young & Thompson

(57) ABSTRACT

Disclosed are an organic electroluminescent element with a light-transmitting electrode having reduced resistivity and emitting a uniform amount of light from the surface, and an associated lighting device. The organic EL element includes: a light-transmitting electrode layer provided on a light-transmitting substrate; an electrode layer forming a pair with the light-transmitting electrode layer; an organic layer between the electrode layers, containing an organic electroluminescent substance; a light-blocking auxiliary electrode formed on the light-transmitting electrode layer in contact with a part of the light-transmitting electrode layer; and an insulating coating film covering the auxiliary electrode. The auxiliary electrode has a low resistivity layer formed from a low resistivity material with a low specific resistance relative to the light-transmitting electrode layer and a coating layer formed from a high melting point material with a higher melting point than the low resistivity material.

13 Claims, 2 Drawing Sheets

(56) References Cited

U.S. PATENT DOCUMENTS

| | | | |
|---|---|---|---|
| 6,133,581 A | 10/2000 | Terao et al. | |
| 6,597,121 B2 * | 7/2003 | Imura | 315/169.3 |
| 7,235,883 B2 | 6/2007 | Nagayama et al. | |
| 8,513,879 B2 | 8/2013 | Tamonoki et al. | |
| 8,624,486 B2 | 1/2014 | Mima | |
| 2003/0085403 A1 | 5/2003 | Nagayama et al. | |
| 2005/0248266 A1 * | 11/2005 | Hosokawa | 313/504 |
| 2006/0158095 A1 * | 7/2006 | Imamura | 313/500 |
| 2009/0142984 A1 * | 6/2009 | Logunov et al. | 445/25 |
| 2010/0013805 A1 * | 1/2010 | Park | 345/204 |
| 2010/0127617 A1 | 5/2010 | Hayafuji et al. | |
| 2010/0295759 A1 | 11/2010 | Tanaka | |
| 2013/0328072 A1 | 12/2013 | Tamonoki et al. | |

FOREIGN PATENT DOCUMENTS

| | | |
|---|---|---|
| JP | 11-144877 | 5/1999 |
| JP | 2000-082588 | 3/2000 |
| JP | 2003-036037 | 2/2003 |
| JP | 2003-264193 | 9/2003 |
| JP | 2003-316291 | 11/2003 |
| JP | 2004-140319 | 5/2004 |
| JP | 2004-158442 A | 6/2004 |
| JP | 2004-212493 | 7/2004 |
| JP | 2005-183208 | 7/2005 |
| JP | 2007-095405 | 4/2007 |
| JP | 2007-201327 | 8/2007 |
| JP | 2007-227073 | 9/2007 |
| JP | 2009-140817 | 6/2009 |
| JP | 2009-302083 A | 12/2009 |
| JP | 2009-302273 | 12/2009 |
| JP | 2010-185903 | 8/2010 |
| JP | 2010-272270 | 12/2010 |
| WO | WO 2008/126267 | 10/2008 |
| WO | WO 2010-137633 A1 | 12/2010 |

OTHER PUBLICATIONS

Japanese Office Action dated Aug. 19, 2014 in corresponding Japanese Patent Application No. 2012-549872 with English translation of enclosed wavy lined portion of Japanese Office Action.

Japanese Office Action dated Mar. 17, 2015; Application No. 2012-549872.

* cited by examiner

ORGANIC ELECTROLUMINESCENT ELEMENT AND ORGANIC ELECTROLUMINESCENT LIGHTING DEVICE

TECHNICAL FIELD

The present invention relates to an organic electroluminescent element (also it is referred to as an organic EL element) using an organic material as a luminescent material or an organic electroluminescent lighting device (also it is referred to as an organic EL lighting device), and more particularly to an organic EL element or an organic EL lighting device which is suppressed in non-uniform brightness and has excellent stability.

BACKGROUND

An organic EL element is formed on a light-transmitting substrate by stacking sequentially a light-transmitting electrode layer, an organic layer containing an organic electroluminescent substance and an electrode layer that may or may not have light transmission. Also, an organic EL lighting device having a plurality of organic EL elements arranged in a row on plane is a planar thin film light source having high light utilization since it emits light at a low voltage and responds in a high speed. Such an organic EL lighting device allows light emitted from the organic layer of organic EL element to transmit the light-transmitting electrode layer and the light-transmitting substrate so as to direct to an exterior.

In such an organic EL element, generally a light-transmitting electrode layer is a positive electrode formed from a material having light transmittance such as indium tin oxide (ITO), zinc oxide or tin oxide, and an electrode layer that may or may not have light transmittance is a negative electrode formed from a metallic thin film or the like. The materials used for the light-transmitting electrode layer have a high specific resistance. Therefore, if these materials are formed as a thin film electrode layer, sheet resistance (surface resistivity) and wiring resistance are large. As a result, non-uniform brightness is caused at a region away from a power supply terminal of the light-transmitting electrode layer. This is because the organic EL element emits light by electric field impression. Since an electric field is decreased due to voltage drop at a central portion of the light-transmitting electrode layer away from a power supply terminal, the efficiency of carrier injection is reduced and then light emission is reduced. To solve this problem, an auxiliary electrode is installed on the light-transmitting electrode layer to suppress the reduction of resistance at a region away from a power supply terminal. Since such an auxiliary electrode has a light-blocking property, it is formed by patterning on portions of a surface of the light-transmitting electrode layer. Further, due to suppressing conduction piercing through an organic layer between the auxiliary electrode and the electrode layer formed from a metallic thin film or the like, the auxiliary electrode is coated with a polymer insulating coating film. If the auxiliary electrode is formed from aluminum or silver that allows the light-transmitting electrode layer to have a reduced resistivity, defects in layer structure such as vacancies or voids are generated at an atomic structure level due to electromigration or stressmigration and stability is lowered. Therefore, such an auxiliary electrode is formed from chromium or molybdenum having high stability to operation.

However, an auxiliary electrode formed from chromium or molybdenum, which is suppressed in electromigration or stressmigration and has excellent stability and reliability, an effect of auxiliary electrode that allows a light-transmitting electrode layer to have a reduced resistivity may be insufficient. Further, there is the problem of environment pollution in using chromium or the like.

As organic EL lighting devices which are suppressed in voltage drop at a central portion of a light-transmitting electrode layer, it has been known an organic EL display in which an auxiliary wiring of In, Pb, Sn, In-based alloy or the like is installed on a transparent electrode such as ITO and the efficiency of light emission is 11 m/W or more (Patent document 1), or an organic EL panel in which a rhombic frame-shaped auxiliary electrode is installed between a transparent electrode and an organic light-emitting layer and a power supply terminal unit is installed within the auxiliary electrode to suppress the reduction of brightness (Patent document 2).

Additionally, it has been known an organic EL display having a plurality of displaying regions (organic ELs) in which any one of first and second wirings disposed within each displaying region is stacked on a connection wiring between one displaying region and another displaying region, i.e. in regions without a light-emitting layer including organic ELs, wherein the connection wiring is formed from a material such as Al which has sheet resistance lower than those of first and second wirings, whereby suppressing an increase in wiring electric resistance due to a lengthened wiring (Patent document 3), or a semiconductor device in which a low resistivity metal such as aluminum neodymium alloy (a second metal layer) is coated with molybdenum having a high melting point (a first metal layer) in a intersecting region among a signal line of low resistivity metal such as aluminum neodymium alloy, a power source control line and an scanning line, whereby preventing the generation of a heat hillock of aluminum neodymium alloy due to laser scanning (Patent document 4).

PRIOR ART DOCUMENTS

Patent Documents

Patent document 1: JP Patent Application Publication No. Hei 11-8073
Patent document 2: JP Patent Application Publication No. 2007-227073
Patent document 3: JP Patent Application Publication No. 2007-95405
Patent document 4: JP Patent Application Publication No. 2009-303373

SUMMARY OF THE INVENTION

Problems to be Solved by the Invention

However, there is a need for an organic EL element which has excellent stability and reliability, allows a light-transmitting electrode to have a sufficiently reduced resistivity, emits light from all over a surface of an organic layer at sufficient and uniform brightness, and avoids environment pollution. In addition, there is a problem that the reliability of an organic EL element is lowered by a disconnection or a short due to a thickened insulating coating film formed from a polymer material coating an auxiliary electrode, and further by dark spots due to a trace of moisture or solvent contained in said polymer material.

It is an object of the present invention to provide an organic EL element which is suppressed in the generation of defects such as electromigration or stressmigration, has excellent stability and reliability, allows a light-transmitting electrode to have a reduced resistivity, emits a uniform amount of light from all over the surface, and is reduced in burden on the environment, or an organic EL lighting device using the same.

Means to Solve the Problems

The inventors have studied on an organic EL element, and have found that when an auxiliary electrode formed on a portion of a light-transmitting electrode layer has a low resistivity layer which is formed from a low resistivity material that has a low specific resistance (or volume resistance) in comparison to the light-transmitting electrode layer and a coating layer which is provided on the low resistivity layer and formed from a high melting point material that has a higher melting point than the low resistivity material, an organic EL element having high reliability can be obtained. Also, the inventors have found that by using the organic EL element, the light-transmitting electrode layer has a reduced resistivity, the reduction of light emission efficiency due to voltage drop at a central portion of the element is suppressed, the generation of non-uniform brightness is suppressed for a prolonged period, and the light emission of sufficient and uniform brightness is stably obtained. The inventors have completed the present invention based on these findings.

According to the present invention, provided is an organic electroluminescent element which comprises a light-transmitting electrode layer that is provided on a light-transmitting substrate; an electrode layer that forms a pair with the light-transmitting electrode layer; an organic layer that is held between the electrode layers and contains an organic electroluminescent substance; a light-blocking auxiliary electrode that is formed on the light-transmitting electrode layer so as to be in contact with a part of the light-transmitting electrode layer; and an insulating coating film that covers the auxiliary electrode. The auxiliary electrode has a low resistivity layer which is formed from a low resistivity material that has a low specific resistance in comparison to the light-transmitting electrode layer and a coating layer which is provided on the low resistivity layer and formed from a high melting point material that has a higher melting point than the low resistivity material.

In addition, according to the present invention, provided is an organic electroluminescent lighting device which uses said organic electroluminescent element.

Effects of the Invention

By using an organic EL element or an organic EL lighting device according to the present invention, the generation of defects such as electromigration or stressmigration can be suppressed, excellent stability and reliability can be obtained, a light-transmitting electrode can have a reduced resistivity, a uniform amount of light can be emitted from all over the surface, and burden on the environment can be reduced.

Figure 1:
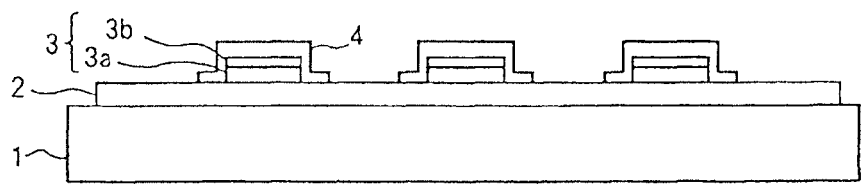
FIG. 1 is a view showing major parts of an example of an organic EL element according to the present invention.

DESCRIPTION OF REFERENCE NUMBERS 1 light-transmitting substrate
2 light-transmitting electrode layer
3, 31 auxiliary electrode
3a, 31a low resistivity layer
3b, 31b coating layer
4 insulating coating film
5 organic layer
6 electrode layer

DESCRIPTION OF EMBODIMENTS

According to the present invention, an organic electroluminescent element comprises a light-transmitting electrode layer that is provided on a light-transmitting substrate; an electrode layer that forms a pair with the light-transmitting electrode layer; an organic layer that is held between the electrode layers and contains an organic electroluminescent substance; a light-blocking auxiliary electrode that is formed on the light-transmitting electrode layer so as to be in contact with a part of the light-transmitting electrode layer; and an insulating coating film that covers the auxiliary electrode. The auxiliary electrode has a low resistivity layer which is formed from a low resistivity material that has a low specific resistance in comparison to the light-transmitting electrode layer and a coating layer which is provided on the low resistivity layer and formed from a high melting point material that has a higher melting point than the low resistivity material.

The light-transmitting substrate used for said organic EL element allows light emitted from a luminous material contained in an organic layer described below to enter from an entrance face thereof and to emit from a light-emitting face opposite the entrance face through a light-transmitting electrode layer. The substrate has preferably high transmittance to light emitted from a luminous material. A material used for the light-transmitting substrate may be selected for example from glasses such as quartz glass, soda glass, borosilicate glass, lead glass, aluminosilicate glass, borate glass and phosphate glass, or resin films. The light-transmitting substrate may have for example a thickness of 0.1~2 mm.

The light-transmitting electrode layer that is stacked on the light-transmitting substrate forms a pair with an electrode layer that may or may not have light transmission and holds the organic layer. The light-transmitting electrode layer is preferably formed from a material having high transmission to light emitted from the organic layer. It may be a positive electrode or a negative electrode. For example, it may be a positive electrode that is formed from indium tin oxide (ITO), indium zinc oxide, tin oxide (NESA glass; manufactured by Coning Inc.) or the like. The light-transmitting electrode layer may have for example a thickness of 100~300 mm.

The auxiliary electrode that is formed on the light-transmitting electrode layer so as to be in contact with a part of the light-transmitting electrode layer has a low resistivity layer which is formed from a low resistivity material and a coating layer which is provided on the low resistivity layer and formed from a high melting point material. The low resistivity material used for the low resistivity layer may use any material as long as it has a low specific resistance relative to the light-transmitting electrode layer. Specifically, at least one selected from aluminum, aluminum neodymium alloy, aluminum nickel alloy, aluminum silver alloy, aluminum cobalt alloy, aluminum germanium alloy, and silver may be used.

These metallic materials are preferably used as low resistivity materials for the auxiliary electrode in that they has a low specific resistance relative to the light-transmitting electrode layer and a low melting point. Particularly, aluminum or aluminum neodymium alloy or silver is more preferably used. For an aluminum alloy, contents of various elements contained in the aluminum alloy are preferably between 0.05 and 5 atomic % with respect to aluminum.

The auxiliary electrode containing these low resistivity materials can suppress the generation of voltage drop at a region away from a power supply terminal in the light-transmitting electrode layer and the reduction of carrier injection efficiency to the organic layer. As a result, an organic EL element can avoid non-uniform brightness to obtain a uniform light emission.

The coating layer provided on the low resistivity layer is formed from a high melting point material that has a higher melting point than the low resistivity material. Such a high melting point material may use those having a higher melting point than the low resistivity material. The high melting point material may have a higher specific resistance than the low resistivity material for the low resistivity layer, but preferably has a lower specific resistance than the low resistivity material. Specifically, at least one selected from molybdenum, molybdenum niobium alloy, molybdenum vanadium alloy, molybdenum tungsten alloy, chromium, titanium and tantalum may be used. Particularly, molybdenum niobium alloy or molybdenum vanadium alloy is preferably used to improve the reliability of auxiliary electrode since they have low resistivity and stress as well as high moisture and corrosion resistance. For a molybdenum alloy, contents of various elements contained in the molybdenum alloy are preferably between 0.05 and 10 atomic % with respect to molybdenum.

The coating layer containing these high melting point materials can suppress the generation of electromigration, stressmigration, voids, corrosion, hillock and the like in the low resistivity layer. Electromigration is vacancies generated in an atomic structure due to electric charge and stressmigration is vacancies generated in an atomic structure due to mechanical stress, respectively. Voids or corrosion is defects or deformation generated in the low resistivity layer due to chemical reactions. Hillock is defects or deformation generated in the low resistivity layer due to heat.

Figure 2:
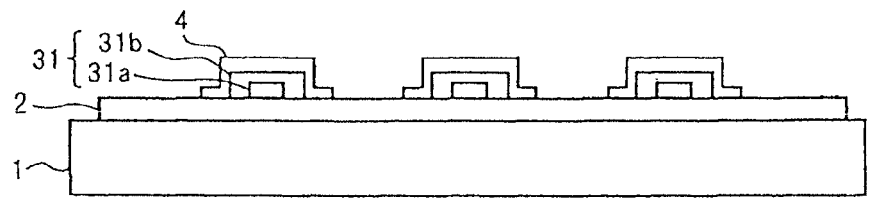
FIG. 2 is a view showing major parts of an example of an organic EL element according to the present invention.

As shown in FIG. 1, the auxiliary electrode may be an auxiliary electrode 3 comprising a low resistivity layer 3a that is provided on a light-transmitting electrode layer 2 so as to be in contact with a part of the light-transmitting electrode layer 2 which is stacked on a light-transmitting substrate 1, and a coating layer 3b which is stacked on a top surface of the low resistivity layer 3a in a so-called overlay manner. Also, as shown in FIG. 2, the auxiliary electrode may be an auxiliary electrode 31 comprising a low resistivity layer 31a, and a coating layer 31b coated on top and side surfaces of the low resistivity layer 31a in an inlay manner, i.e. as a clad structure. The coating layer 31b having such a clad structure is preferred since it may suppress effectively migration in the low resistivity layer. By using this structure, the coating layer can relive thin film stress of the low resistivity layer, and the low resistivity layer may have a larger thickness than conventional manner. As a result, the auxiliary electrode may easily have a reduced resistivity and hence an organic EL element may also have a reduced operation voltage.

Since these materials used for the auxiliary electrode have no light transmission, the auxiliary electrode is preferably provided on a part of a surface of the light-transmitting electrode layer. For example, as a stacked structure is seen from above, the auxiliary electrode may have any shape such as comb, trapezoid, lattice or hexagonal mesh (honeycomb) shape. Also, to obtain a more reduced resistivity and uniform resistance in the light-transmitting electrode layer, the auxiliary electrode may preferably be provided on ends of the light-transmitting electrode layer. Since the auxiliary electrode forms a light-blocking range, a width of the auxiliary electrode, i.e. width of the auxiliary electrode as a stacked structure is seen from above is preferably narrow. However, a width of the auxiliary electrode is preferably selected according to a thickness thereof to suppress the generation of voltage drop at a region away from a power supply terminal of the light-transmitting electrode layer. For example, the auxiliary electrode may have 20 μm~500 μm width and 300 nm~600 nm thickness, but these width and thickness may properly be selected to achieve a desired volume resistivity and hence a reduced amount of light transmission, such as employing 3~10 mm as a distance of one side in a lattice or a diameter of inscribed circle in a hexagonal mesh. In addition, in the auxiliary electrode having width and thickness indicated above, a thickness of the low resistivity layer at a region where the low resistivity layer and the coating layer are stacked may be for example 150 nm~560 nm, and the coating layer may be provided on the low resistivity layer having thickness indicated above as a thickness of 20 nm~75 nm, so as to suppress electromigration and the like in the low resistivity layer. By using this auxiliary electrode, the resistivity of the light-transmitting electrode layer may be in the range of 0.1 Ω/□ (low resistivity layer 500 nm)~0.4 Ω/□ (low resistivity layer 150 nm).

An insulating coating film coated on the auxiliary electrode may be formed from polymer organic materials or inorganic materials. When the auxiliary electrode is formed by photolithography, a used resist may serve as an insulating coating film. When the low resistivity layer and the coating layer are simultaneously formed by single photolithography, or when the coating layer is formed by photolithography after forming the low resistivity layer, the remaining resist on the coating layer after etching is heated at a temperature between the melting point and the softening point of the resist to flow the resist to sides of the auxiliary electrode and to form an insulating coating film thereon. Examples of polymer organic materials used for such an insulating coating film may include acrylic, polyimide or novolac. When the insulating coating film is formed from organic materials, it has preferably a thickness of 800 nm~1500 nm.

When the insulating coating film is formed from inorganic materials, preferably such inorganic materials includes at least one selected from silicon nitride, silicon oxide and silicon oxinitride. These inorganic materials have light transmission. Since the resulting film may be thin film relative to a film formed from organic materials, and may have low contraction and residual stress, the disconnection of auxiliary electrode may be suppressed. Also, since the insulating coating film formed from these inorganic materials do not contain water or an organic solvent, the generation of dark spots may be suppressed in an organic EL element. As the insulating coating film of inorganic materials suppresses a continuity between an auxiliary electrode and a counter electrode (negative electrode) and disconnection, it may have for example 40 μm~600 μm width and 50 nm~500 nm thickness, and preferably a thickness of 100 nm~300 nm.

The organic layer provided on the light-transmitting electrode layer may comprise a plurality of layers such as a light-emitting layer containing an organic electroluminescent substance, a hole-transporting layer and an electron-transporting layer which hold the light-emitting layer, a hole-injection layer and an electron-injection layer which hold said layers, and a carrier block layer that blocks holes or electrons to increase the efficiency of light emission.

The hole-injection layer is provided to lower the height of an injection barrier to holes injected from the light-transmitting electrode layer as a positive electrode to the organic layer, to relieve a difference in energy levels between the positive electrode and the hole-transporting layer, and to facilitate the injection of holes injected from the positive electrode to the hole-transporting layer. As materials used to form the hole-injection layer, examples may include aryl amine derivatives such as copper phthalocyanine (CuPc) or starburst-like aromatic amines, or said hole-injection organic materials doped chemically with inorganic substances such as $V_2O_5$ or $MoO_3$ or organic substances such as F4-TCNQ, so as to lower additionally the injection barrier and to decrease operation voltage.

The hole-transporting layer is preferably formed from materials that have a proper ionization potential to promote the movement of holes to the light-emitting layer and an electron affinity to inhibit the leakage of electrons from the light-emitting layer. As materials used to form the hole-transporting layer, examples may include triphenyldiamines such as bis(di(p-tolyl)aminophenyl)-1,1-cyclohexane, TPD, N,N'-diphenyl-N-N-bis(1-naphthyl)-1,1'-biphenyl)-4,4'-diamine (α-NPD), or starburst-like aromatic amines.

The light-emitting layer serves to re-couple holes with electrons injected from an electrode and emits fluorescence and phosphorescence. As luminous materials used to form the light-emitting layer, examples may include low molecular weight compounds such as tris(8-quinolinol)aluminum complex (Alq3), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl)perylenetetracarboxylic acid diimide (BPPC) and 1,4-bis(N-p-tolyl-N-4-(4-methylstyryl) phenylamino)naphthalene, or high molecular weight compounds such as polyphenylenevinylene polymers.

Also, as a luminous material having a double component system comprising a host and a dopant may be used, wherein excited energy generated by host molecules is moved to dopant molecules and light is emitted from the dopant molecules. As luminous materials having a double component system, luminous materials, electron-transporting materials and hole-transporting materials indicated above may be used. Examples may include host quinolinol metal complexes such as Alq3 doped with dopant such as 4-dicyanomethylene-2-methyl-6-(p-dimethylaminostyryl)-4H-pyran (DCM), quinacridone derivatives such as 2,3-quinacridone, or coumarin derivatives such as 3-(2'-benzothiazole)-7-diethylaminocoumarin, host electron-transporting materials such as bis(2-methyl-8-hydroxy quinoline-4-phenylphenol-aluminum complex doped with dopant condensed polycyclic aromatics such as perylene, or host hole-transporting materials such as 4,4'-bis(m-tolylphenylamino)biphenyl (TPD) doped with dopant rubrene, or host carbazole compounds such as 4,4'-biscarbazolylbiphenyl (CBP) or 4,4'-bis(9-carbazolyl)-2,2'-dimethylbiphenyl (CDBP) doped with dopant such as platinum complexes or iridium complexes such as tris-(2-phenylpyridine) iridium complex (Ir(ppy)3), (bis(4,6-difluorophenyl)-pyridinate-N,C2')picolinate iridium complex (FIr(pic)), (bis(2-(2'-benzo-4,5-α-thienyl)pyridinate-N,C2')acetylacetonate) iridium complex (Btp2Ir(acac)), Ir(pic)3 and Bt2Ir(acac).

These luminous materials may be selected according to a desired lighting color of an organic EL lighting device. Specifically, for green lighting, Alq3 and quinacridone, coumarin, Ir(ppy)3 or the like as a dopant may be used; for blue lighting, DPVBi and perylene, distyrylarylene derivatives, FIr(pic) or the like as a dopant may be used; for green to green-blue lighting, OXD-7 or the like may be used; for red-orange lighting, DCM, DCJTB or the like as a dopant may be used; and for yellow lighting, rubrene, Bt2Ir(acac) or the like as a dopant may be used; and for white lighting, a combination of luminous materials such as host Alq3 and guest DCM (orange) may be used.

As a light-emitting layer for white lighting, a three-layered structure containing respectively luminous materials emitting respectively red, green and blue color, or a double-layered structure containing respectively luminous materials emitting complementary colors such as blue and yellow colors may be used. Also, a single layer structure containing a combination of such luminous materials may be used through co-deposition of materials emitting each color. In addition, luminous materials constituting each color layer in the three-layered or double-layered structure are sequentially aligned as fine pixels such as red, blue, green or the like on plane to form a light-emitting layer.

The electron-transporting layer stacked on the light-emitting layer is preferably formed from materials that have a proper electron affinity to promote the movement of electrons to the light-emitting layer and an ionization potential to inhibit the leakage of holes from the light-emitting layer. As materials used to form the electron-transporting layer, examples may include organic materials such as oxadiazole derivatives such as 2-(4-biphenylyl)-5-(4-t-butylphenyl)-1,3,4-oxadiazole (Bu-PBD) and OXD-7, triazole derivatives, quinolinol-metal complexes or the like, or said organic materials doped chemically with electron donors such as alkali metals, for example lithium.

A hole-block layer may be provided between the light-emitting layer and the electron-transporting layer, so as to block holes passing through the light-emitting layer without lighting and to promote the re-coupling probability thereof. As materials for such a hole-block layer, 2,9-dimethyl-4,7-diphenyl-1,10-phenanthroline (BCP), triphenyldiamine derivatives, triazole derivatives or the like may be used.

Additionally, an electron-injection layer may be formed on the electron-transporting layer. When electron injection is inhibited due to a large energy difference between the work function of a metallic material such as aluminum used to form an electrode layer serving as a negative electrode and the electron affinity (LUMO level) of the electron-transporting layer, the electron-injection layer is provided to facilitate the injection of electrons from the electrode layer to the electron-transporting layer. As materials used to form the electron-injection layer, examples may include fluorides or oxides of alkali metals such as lithium or cesium or alkali earth metals such as calcium, or materials having a low work function such as magnesium silver alloy or lithium aluminum alloy.

An organic layer provided between said electrode layers may have for example each 1~500 nm thickness, and the total 100~1000 nm thickness.

The electrode layer that forms a pair with a light-transmitting electrode may be preferable whether it has light transmittance or not. When the light-transmitting electrode layer is formed from materials for light-transmitting electrode indicated above, for example it is preferably formed as a light-blocking negative electrode of a metallic thin film such as aluminum or silver, so that light emitted from the organic layer is reflected towards the light-transmitting electrode layer, and a reduction in amount of light emitted from a light-emitting surface is suppressed. Also, if the electrode layer is formed from materials for light-transmitting electrode indicated above, the resulting organic EL element has two-faced light transmittance. A thickness of the electrode layer may be preferably large in view of voltage drop due to wiring resistance, for example 50~300 nm. Preferably, one end of the electrode layer may be extended to form a connection unit with a wiring member.

Figure 3:
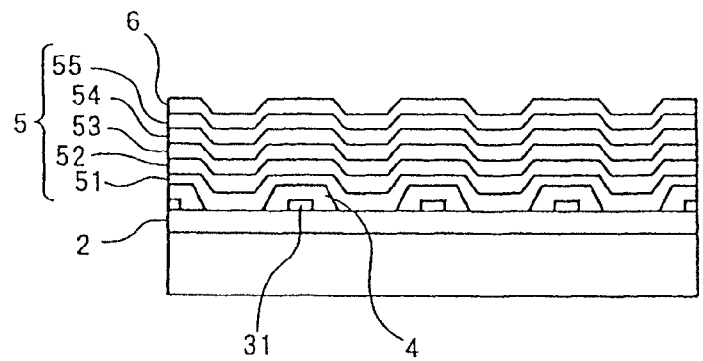
FIG. 3 is a side view showing an example of an organic EL element according to the present invention.
Figure 4:
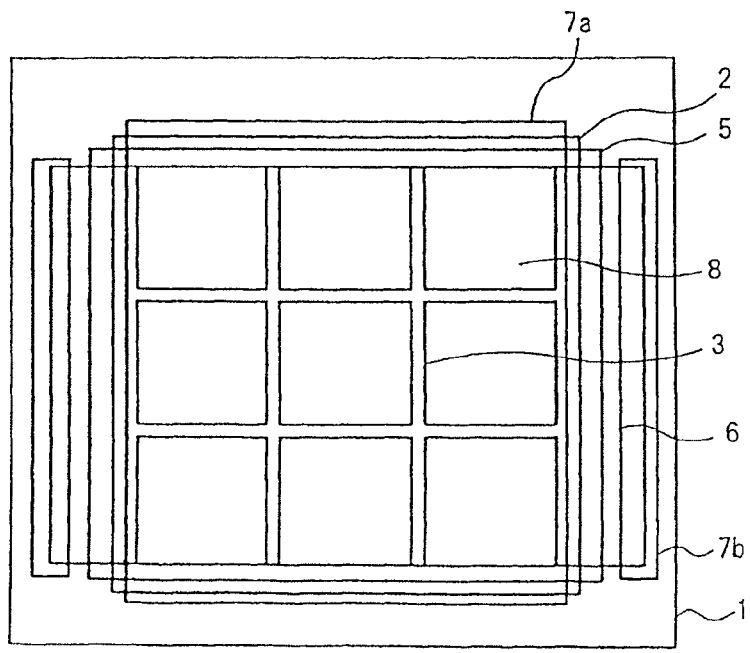
FIG. 4 is a top view showing an example of an organic EL element according to the present invention.

As an example of such an organic EL element, an organic EL element shown in FIG. 3 and FIG. 4 (FIG. 3 is a side view and FIG. 4 is a top view) is described. The organic EL element has a layered structure comprising a light-transmitting electrode layer 2 formed on a light-transmitting substrate 1, a lattice type auxiliary electrode 31 provided on the light-transmitting electrode layer, an insulating coating film 4 coated on the auxiliary electrode, an organic layer 5 having a hole-injection layer 51, a hole-transporting layer 52, a light-emitting layer 53, an electron-transporting layer 54 and an electron-injection layer 55, and an electrode layer 6 formed on the organic layer 5. The auxiliary layer 31 has an inlay type coating layer (not shown) which coats a low resistivity layer over top and side surfaces.

A method of manufacturing such an organic EL element is described below. The light-transmitting electrode layer is stacked on the light-transmitting substrate. The light-transmitting electrode layer may be stacked on the desired regions of the light-transmitting substrate using a shadow mask by sputtering, vapor deposition, CVD or the like, or may be patterned as a desired pattern by photolithography from a light-transmitting electrode film formed uniformly all over the surface by sputtering, vapor deposition, CVD or the like.

As a method of forming the auxiliary electrode, an auxiliary electrode material may be formed as a uniform film having a desired thickness on the light-transmitting electrode layer using sputtering, vacuum vapor deposition, CVD or the like, and the desired pattern may be formed by photolithography. To form an inlay type auxiliary electrode, a low resistivity material and a high melting point material are individually subjected to film formation and photolithography. To form an overlay type auxiliary electrode, a film of a low resistivity material is firstly formed, and then a film of a high melting point material is stacked thereon. Subsequently, the desired pattern may be formed by single photolithography.

Preferably, a connection unit 7a (FIG. 4) and a connection unit 7b (FIG. 4) are formed simultaneously with the formation of the auxiliary electrode, so that the number of manufacturing processes is reduced and the connection units have a reduced resistivity. The connection unit 7a connects the light-transmitting electrode layer to a connection wiring, and a connection unit 7b connects the electrode layer that forms a pair with the light-transmitting electrode layer to a connection wiring, wherein the electrode layer may or may not have light transmittance. To suppress resistance increase, each connection unit 7a, 7b has preferably the same width as the width of one side of the light-transmitting electrode layer.

Now, regarding a method of forming the low resistivity layer, a photolithography method performed on a film of a low resistivity material stacked on the light-transmitting electrode layer will be specifically described below. However, the same operation may be also performed on a layered structure in which a high melting point material is stacked on the film of a low resistivity material, or a film of a high melting point material stacked on the low resistivity layer to form an inlay type coating layer.

The film of low resistivity material is coated with a resist. Then, the film is sequentially subjected to pre-baking to solidify the coated resist, exposure to light, development, and if necessary, removal of a rinse solution used in development or baking to enhance adhesion between the resist and the auxiliary electrode material film. Subsequently, etching is performed to pattern the film of low resistivity material as a desired pattern. The used resist may be a negative type that is reduced in solubility to a developer due to exposure, or a positive type that is increased in solubility to a developer due to exposure. For example, the resist may be prepared by dispersing a binder resin, a photosensitive monomer such as polyimides, acrylics and novolacs, a photo polymerization initiator, a coupling agent and the like in a solvent.

If a negative type resist is used, the exposure is performed using a mask that exposes parts of the low resistivity layer. To the contrary, if a positive type resist is used, the exposure is performed using a mask that exposes parts other than the low resistivity layer. The exposure may be performed using any actinic lay as long as it can induce polymerization of monomers contained in a resist, and it is preferred to use ultraviolet rays.

A method for development of an exposure ray may be properly selected from shower, dipping and paddle methods. As a developer, for a positive type resist, organic alkali developers such as tetramethylammoniumhydrooxide (TMAH) or inorganic alkali developers such as alkali hydroxides, for example potassium hydroxide or alkali carbonates may be used. For a negative type resist, developers such as organic solvents, for example TMAH or xylene may be used. After development, unnecessary portions are fully removed by rinsing using pure water or the like, and as necessary, heating is performed to dry a rinse liquid and to enhance adhesion between the resist and the low resistivity material film.

The low resistivity material film may be etched by any of dry etching and wet etching. The dry etching may be performed by any one of plasma etching, chemical etching or reactive ion etching. Also, isotropic dry etching may be performed using fluorides such as $F_2$, $CF_4$, $C_2F_6$, $CHF_3$, $SF_6$ or the like, carbon tetrachloride, or an etching gas containing said substances and oxygen. Besides, when etching indium tin oxide, methanol and argon may be used. Wet etching may be performed using any one of shower, dipping or batch methods. As etching solutions, for aluminum, phosphoric acid, nitric acid and as necessary acetic acid may be used; for molybdenum, tungsten, tantalum or the like, hydrofluoric acid, nitric acid and as necessary acetic acid may be used; for chromium or the like, ceric ammonium nitrate and perchloric acid may be used; and for indium tin oxide, an etching solution containing hydrochloric acid and nitric acid may be used. The low resistivity material film is patterned as a desired pattern by such etching to form the low resistivity layer.

When an insulating coating film coating the auxiliary electrode is formed using an inorganic material, the film may be formed using a method similar to that used in forming the auxiliary electrode. That is, a material for the insulating coating film such as silicon compounds listed above is uniformly formed on the light-transmitting electrode layer and the auxiliary electrode as a film having a desired thickness by sputtering, vacuum vapor deposition, CVD or the like. Then, a desired pattern may be formed thereon by photolithography similar to that used in forming the auxiliary electrode.

As a method of forming an organic layer of a hole-injection layer, a middle layer, a hole-transporting layer, a light-emitting layer, an electrode-transporting layer and an electrode-injection layer, a method of forming films of a desired shape using materials for said layers and shadow masks by a vacuum vapor deposition through resistance heating, MBE, laser-ablation method or the like. Alternatively, a desired shape may be formed by an inkjet method using liquid materials. Further, a film may be formed by a spin coating or slit coating method using a photosensitive coating solution, and a desired shape may be formed by photolithography.

The electrode layer provided on the organic layer may be formed using a vacuum vapor deposition or sputtering method. Preferably, the electrode layer is formed while cooling out the light-transmitting substrate. When the electrode layer is formed by vapor deposition of metals, for example aluminum, a temperature of deposition sources may be at least 1300° C. Also, when forming a thickened film to decrease wiring resistance, or performing continuous forming process, a temperature of the light-transmitting substrate may reach at least 150° C. Such high temperatures result in the local penetration of deposition metals from a surface of the organic layer into the interior thereof. As a result, disconnection may be generated. When the electrode layer is formed by sputtering using aluminum, sputtered material particles reach a surface of the organic layer with kinetic energy larger than that of vacuum vapor deposition. Likewise, sputtered particles also penetrate the interior of the organic layer locally at a microscopical level, resulting in disconnection. To suppress this phenomenon, the light-transmitting substrate is preferably cooled out by 0~25° C., so that migration due to deposition or sputtered particles and hence disconnection can be suppressed. Preferably, the electrode layer is provided with extension to the connection unit 7b with a connection wiring.

Figure 5:
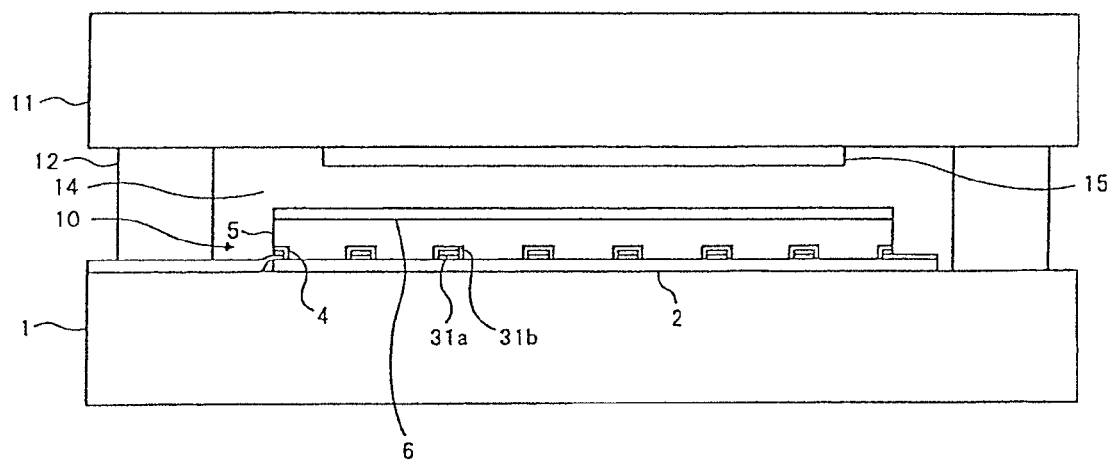
FIG. 5 is a cross-sectional view showing an example of an organic EL lighting device according to the present invention.

An organic EL lighting device of the present invention is not particularly limited as long as the device has organic EL elements manufactured by a method described herein, and the device shown in FIG. 5 is described as an example. The organic EL lighting device shown in FIG. 5 has a plurality of organic EL elements 10, the organic EL elements comprising a light-transmitting substrate 1, a light-transmitting electrode layer 2, an auxiliary electrode 3 having a low resistivity layer 31a and a coating layer 31b, an insulating coating film 4, an organic layer 5, and an electrode layer 6. A part of the auxiliary electrode or a connection unit (not shown) is provided with extension to an exterior, and a sealing member 11 is connected to the light-transmitting substrate using a seal member 12, so that the organic EL element including the organic layer is accommodated within an airtight space 14. In this case, only the low resistivity layer of the auxiliary electrode may be provided with extension to an exterior from the airtight space. Also, in FIG. 5, only a single organic EL element is shown, but organic EL elements in a row on plane are not shown. A proper gas is filled in the airtight space. A getter material 15 held in the sealing member 11 adsorbs oxygen, water and the like present in the airtight space to suppress the oxidation of the organic EL element. A connection unit (not shown) provided with extension to an exterior from the airtight space where the light-transmitting electrode layer and the auxiliary electrode are stacked, and a connection unit (not shown) to which the electrode layer is connected is respectively connected to a wiring member (not shown). As the wiring member, a film of copper polyimide or the like may be used. Copper polyimide is preferred since it has electric conductivity, low resistance and flexibility and it may be connected without an accurate positioning. In addition, the other end of the wiring member is connected to a connecting terminal of a substrate having a lighting circuit, a control circuit for a lighting circuit and the like to enable the supply of external power to the light-transmitting electrode layer and the electrode layer.

By using an organic EL lighting device described herein, non-uniform brightness is suppressed, and as a result, uniform lighting having a constant brightness can be obtained.

EXAMPLES

Now, an example of an organic EL lighting device according to the present invention will be specifically described.

An ITO film serving as a light-transmitting electrode is stacked on a glass substrate 1 as a light-transmitting substrate by a vacuum sputtering or vacuum vapor deposition method. Then, the resulting light-transmitting electrode film is exposed by photolithography. Then, a desired pattern is formed by dry or wet etching to form a light-transmitting electrode layer 2. Subsequently, a low resistivity material film is uniformly formed on the light-transmitting electrode layer by vacuum vapor deposition, sputtering, CVD or the like using a low resistivity material selected from Al, AlNd alloy, AlNi alloy, AlAg alloy, AlCo alloy, AlGe alloy and Ag. Then, on said low resistivity material film, a film is formed by vacuum vapor deposition, sputtering, CVD or the like using a high melting point material selected from Mo, MoNb alloy, MoV alloy, MoW alloy, Cr, Ti and Ta. The obtained film is coated with a negative type resist at a thickness of 0.1~5 μm, and heated at about 90° C. for 90 sec to form a resist film. Subsequently, the resist film is exposed using a mask having a pattern for an auxiliary electrode. The exposure is performed at a dose of 50~200 mJ/cm$^2$ using a mixed rays of g-ray, h-ray and I-ray. The resulting film is developed using TMAH and rinsed with pure water. Then, the resist film is patterned as patterns of an auxiliary electrode and a connection unit, and heated at a temperature less than the glass transition temperature of the resist, for example at 90~150° C. for 1 min to dry the rinse liquid and to enhance adhesion between the resist and the auxiliary electrode. By wet or dry etching, the low resistivity material and high melting point material films are removed from portions that are not coated with the resist to form an overlay type auxiliary electrode.

To form an inlay type auxiliary electrode, film formation, photolithography and etching processes are repeated for each of a low resistivity material and a high melting point material. A low resistivity material film formed uniformly on the light-transmitting electrode layer is patterned as a desired pattern by photolithography using the same method as described above. Then, a resist on the low resistivity material film is removed by wet or dry peeling. A high melting point material film is also patterned by the same method as described for the low resistivity material film. A line width of the high melting point material film should be larger than that of the low resistivity material film, so as to obtain an inlay type auxiliary electrode.

Then, using an insulating coating film material selected from silicon nitride, silicon oxide and silicon oxinitride, the auxiliary electrode is coated with an insulating coating film by the same operations as described for the auxiliary electrode, i.e. film formation, photolithography and etching.

Then, thin films are sequentially formed using a hole-injection material such as CuPc, a hole-transporting material such as α-NPD, a luminous material such as DPVBi, Alq3 and DCM selected for a white lighting and an electron-transporting material such as OXD-7 by vacuum vapor deposition through resistance heating, so as to form hole-injection and -transporting layers, a light-emitting layer and an electron-transporting layer. Subsequently, an electron-injection material such as lithium fluoride is stacked on the electron-transporting layer by vacuum vapor deposition to form an electron-injection layer. Additionally, a thin film is stacked thereon using an electrode material such as aluminum by vacuum vapor deposition to form an electrode layer.

Further, an inkjet ink is prepared using poly(3,4-ethylenedioxythiophene) (PEDOT) and polystyrenesulfonic acid (PSS), or polyaniline and PSS as an hole-transporting material, and a hole-transporting layer is formed by an inkjet method. Then, an inkjet ink is prepared using polyparaphenylenevinylene (PPV) derivatives, polyfluorene (PF) derivatives, polythiophene (PAT), and polyparaphenylene (PPP) as a luminous material, and a light-emitting layer may be formed by an inkjet method.

Then, an organic EL lighting device is fabricated by connecting a wiring member of a polyimide film having a copper foil stacked thereon to connection units of the light-transmitting electrode layer and the electrode layer by heat pressing, respectively, and by connecting the other end of the wiring member to a connection terminal of a substrate having a lighting circuit, a control circuit for a lighting circuit and the like.

Example 1

An ITO film serving as a light-transmitting electrode was patterned using the method described above such that a light-emitting region was 90×90 mm. On the film, a low resistivity layer of AlNd alloy was formed as a lattice pattern of 30 μm width, 350 nm thickness and 4 mm distance. Then, using MoW alloy, a coating layer was formed on the low resistivity layer. A width of the coating layer was 40 μm and a thickness thereof was 70 nm above the low resistivity layer (the total thickness of an auxiliary electrode was 420 nm), so that the low resistivity layer was entirely covered with the coating layer to form an inlay type auxiliary electrode. Further, a silicon oxide film was formed on the auxiliary electrode. A width of the silicon oxide film was 60 nm and a thickness thereof was 300 nm above the auxiliary electrode, so that the auxiliary electrode was entirely covered with the silicon oxide film. Then, an organic EL element was manufactured using CuPc as a hole-injection material, α-NPD as a hole-transporting material, CBP doped with Ir(ppy)3, Btp2Ir(acac) and additionally FIr(pic) as a luminous material, BCP as a hole-block layer, Alq3 as an electron-transporting layer, LiF as an electron-injection material, and Al as a negative electrode.

When using the operation current of 100 A/m$^2$ on the organic EL element, an operation voltage was 6.6V and brightness was 3150 cd/m$^2$. The non-uniformity of brightness in a facet of the organic EL element was 5% or less as determined by the expression "(difference between the maximum brightness and the minimum brightness)/the maximum brightness" after measuring brightness at 9 points in the facet. The organic EL lighting device was continuously lighted at the current density indicated above. As a result, the half-life of brightness was prolonged up to 5200 hours, and the organic EL lighting device was stably lighted even after 5200 hours.

Comparative Example 1

An organic EL element was prepared using the same method as in Example 1 except for using a single layer of AlNd alloy as the auxiliary electrode, and was operated at the same current density as in Example 1. An operation voltage was 6.7V and brightness was 3020 cd/m$^2$. The non-uniformity of brightness in a facet of the organic EL element was 5% or less as determined by the expression "(difference between the maximum brightness and the minimum brightness)/the maximum brightness" after measuring brightness at 9 points in the facet. The organic EL lighting device was continuously lighted under the condition indicated above. As a result, disconnection was generated in the vicinity of an auxiliary wiring within 1000 hours, and the organic EL lighting device was lighted out.

Comparative Example 2

An organic EL element was prepared using the same method as in Example 1 except for omitting the low resistivity layer, the coating layer and the insulating coating film, and was operated at the same current density as in Example 1. An operation voltage was 7.6V and brightness was 2780 cd/m$^2$. The non-uniformity of brightness in a facet of the organic EL element was 35% or less as determined by the expression "(difference between the maximum brightness and the minimum brightness)/the maximum brightness" after measuring brightness at 9 points in the facet. The organic EL lighting device was continuously lighted under the condition indicated above. As a result, disconnection was generated in the vicinity of an auxiliary wiring within 1000 hours, and the organic EL lighting device was lighted out.

The present invention incorporates all descriptions of the specification, claims and drawings firstly attached to JP Patent Application No. 2010-287823.

INDUSTRIAL APPLICABILITY

An organic electroluminescent element according to the present invention can emit light at a low voltage and response in a high speed, has excellent stability, and is useful for a flat lighting device, a flat display and the like.

The invention claimed is:

1. An organic electroluminescent element comprising:
    a light-transmitting electrode layer that is provided on a light-transmitting substrate;
    an electrode layer that forms a pair with the light-transmitting electrode layer;
    an organic layer that is held between the pair of electrode layers and contains an organic electroluminescent substance;
    a light-blocking auxiliary electrode that is formed on the light-transmitting electrode layer so as to be in contact with a part of the light-transmitting electrode layer; and
    an insulating coating film in contact with the auxiliary electrode, that covers the auxiliary electrode,
    wherein the auxiliary electrode comprises:
    a low resistivity layer that is formed from a low resistivity material comprising at least one selected from the group consisting of aluminum, aluminum neodymium alloy, aluminum nickel alloy, aluminum silver alloy, aluminum cobalt alloy, aluminum germanium alloy, and silver, that has a lower specific resistance in comparison to the light-transmitting electrode layer; and
    a coating layer that is provided on the low resistivity layer and is formed from a high melting point material comprising at least one of molybdenum niobium alloy and molybdenum vanadium alloy, that has a higher melting point than the low resistivity material.

2. The organic electroluminescent element of claim 1, wherein the coating layer covers top and side surfaces of the low resistivity layer.

3. The organic electroluminescent element of claim 1, wherein the insulating coating film comprises at least one selected from silicon nitride, silicon oxide and silicon oxynitride.

4. An organic electroluminescent lighting device having the organic electroluminescent element according to claim 1.

5. The organic electroluminescent lighting device of claim 4, wherein a connection terminal for the organic electroluminescent element is made of the low resistivity material.

6. The organic electroluminescent element of claim 2, wherein the insulating coating film includes at least one selected from silicon nitride, silicon oxide and silicon oxynitride.

7. An organic electroluminescent lighting device having the organic electroluminescent element according to claim 2.

8. An organic electroluminescent lighting device having the organic electroluminescent element according to claim 3.

9. The organic electroluminescent element of claim 1, wherein the low resistivity material comprises at least one of aluminum, aluminum neodymium alloy, and silver.

10. An organic electroluminescent element comprising:
a light-transmitting electrode layer that is provided on a light-transmitting substrate;
an electrode layer that forms a pair with the light-transmitting electrode layer;
an organic layer that is held between the pair of electrode layers and contains an organic electroluminescent substance;
a light-blocking auxiliary electrode that is formed on the light-transmitting electrode layer so as to be in contact with a part of the light-transmitting electrode layer; and
an insulating coating film in contact with the auxiliary electrode, that covers the auxiliary electrode,
wherein the auxiliary electrode comprises:
a low resistivity layer that is formed from a low resistivity material comprising aluminum neodymium alloy that has a lower specific resistance in comparison to the light-transmitting electrode layer; and
a coating layer that is provided on the low resistivity layer and is formed from a high melting point material comprising molybdenum tungsten alloy that has a higher melting point than the low resistivity material.

11. The organic electroluminescent element of claim 10, wherein the coating layer covers top and side surfaces of the low resistivity layer.

12. The organic electroluminescent element of claim 10, wherein the insulating coating film comprises at least one selected from silicon nitride, silicon oxide and silicon oxynitride.

13. An organic electroluminescent lighting device having the organic electroluminescent element according to claim 10.

* * * * *